United States Patent [19]

Schlacter

[11] 4,005,240
[45] Jan. 25, 1977

[54] GERMANIUM DEVICE PASSIVATION

[75] Inventor: Michael M. Schlacter, Irvine, Calif.

[73] Assignee: Aeronutronic Ford Corporation, Blue Bell, Pa.

[22] Filed: Mar. 10, 1975

[21] Appl. No.: 556,719

[52] U.S. Cl. .................. 428/333; 428/433; 428/450; 427/74; 427/93; 427/95

[51] Int. Cl.² ............... C23C 11/00; H01L 23/00; H01L 31/02

[58] Field of Search .......... 427/93, 95, 74; 428/333, 433, 450

[56] References Cited

UNITED STATES PATENTS

| 3,313,661 | 4/1967 | Blake | 427/95 X |
|---|---|---|---|
| 3,481,781 | 12/1969 | Kern | 427/95 |
| 3,607,378 | 9/1971 | Ruggiero | 427/95 |
| 3,668,004 | 6/1972 | Yamamoto et al. | 427/95 X |
| 3,737,340 | 6/1973 | Maeda et al. | 427/95 X |

Primary Examiner—Ralph S. Kendall
Attorney, Agent, or Firm—Robert D. Sanborn

[57] ABSTRACT

Germanium devices such as diodes, transistors and photodetectors are passivated by coating their surfaces with phosphosilicate glass. In the case of photosensitive devices the thickness of the passivating glass can be controlled to also provide antireflective coating action.

6 Claims, 2 Drawing Figures

GERMANIUM DEVICE PASSIVATION

BACKGROUND OF THE INVENTION

Semiconductor devices ordinarily require passivating coatings particularly in the vicinity of junctions. Such passivation has a three-fold effect. It acts to terminate the crystal lattice in a way that preserves the desired electrical characteristics, it reduces the effect of ionic contaminants at the ambient-device interface, and it provides mechanical protection for the semiconductor surface. Typically such a layer acts upon the surface in a way that does not alter surface recombination, at least it does not increase recombination excessively. It must not act as a donor or acceptor material and should not introduce mechanical strain. Particularly in the case where relatively thick coatings are desired, thermal expansion mismatch should be avoided. This is of paramount importance when dealing with devices that operate at cryogenic temperatures and therefore are subject to cycling over very large temperature ranges.

Silicon dioxide has proven to be an excellent material for the passivation of silicon devices. More recently it has been found that if the silicon dioxide is overlaid with an oxide containing phosphorous oxide, even better passivation occurs. In general, glass and simple mixtures of metal oxides and/or nitrides have been used for passivation, and in certain special cases organic compounds have proven effective. In the case of silicon, the genetic oxide, or one that is grown from the parent silicon crystal, has proven to be the most compatible. Typically the genetic oxide is limited in thickness and is overlaid with a deposited oxide or oxide mixture.

In the case of germanium satisfactory passivation is not as simple or easy as for silicon. The genetic oxide is not usually acceptable mechanically, it is a poor insulator, it volatalizes at the elevated temperatures that are normally found in device processing, and is easily dissolved by many solvents normally used in device processing. Accordingly germanium passivation is difficult and many different processes have been developed. Commonly that passivation process is employed having the fewest deleterious effects on device performance while providing the required mechanical properties. For example, silicon dioxide deposited onto a clean germanium surface will provide some passivation but it is not good either electrically or mechanically.

SUMMARY OF THE INVENTION

It is an object of the invention to provide a passivating coating for germanium semiconductor devices.

It is a further object to provide a passivating coating for germanium devices that can be easily applied at moderate temperatures and which will withstand higher temperatures subsequently, and yet will remain intact after cycling to cryogenic temperatures.

These and other objects are achieved by vapor depositing a coating of silicon dioxide along with a small percentage of phosphorous oxide on the surface of the germanium device. The preferred coating contains about 4% by weight of phosphorous oxide and is deposited at high rate and at low temperature using chemical vapor deposition.

I have found that such phosphosilicate glass (PSG) is unexpectedly an excellent germanium passivating coating. Such PSG films operate so well on germanium that repeated cycling of thick layers between room temperature and about 77° kelvin has no disruptive effect. Finally I have found that if the PSG film is controlled in thickness it can be used in addition as an antireflective coating and is therefore useful in tailoring germanium photodetectors to particular photo response wavelengths.

DESCRIPTION OF THE INVENTION

Figure 1:
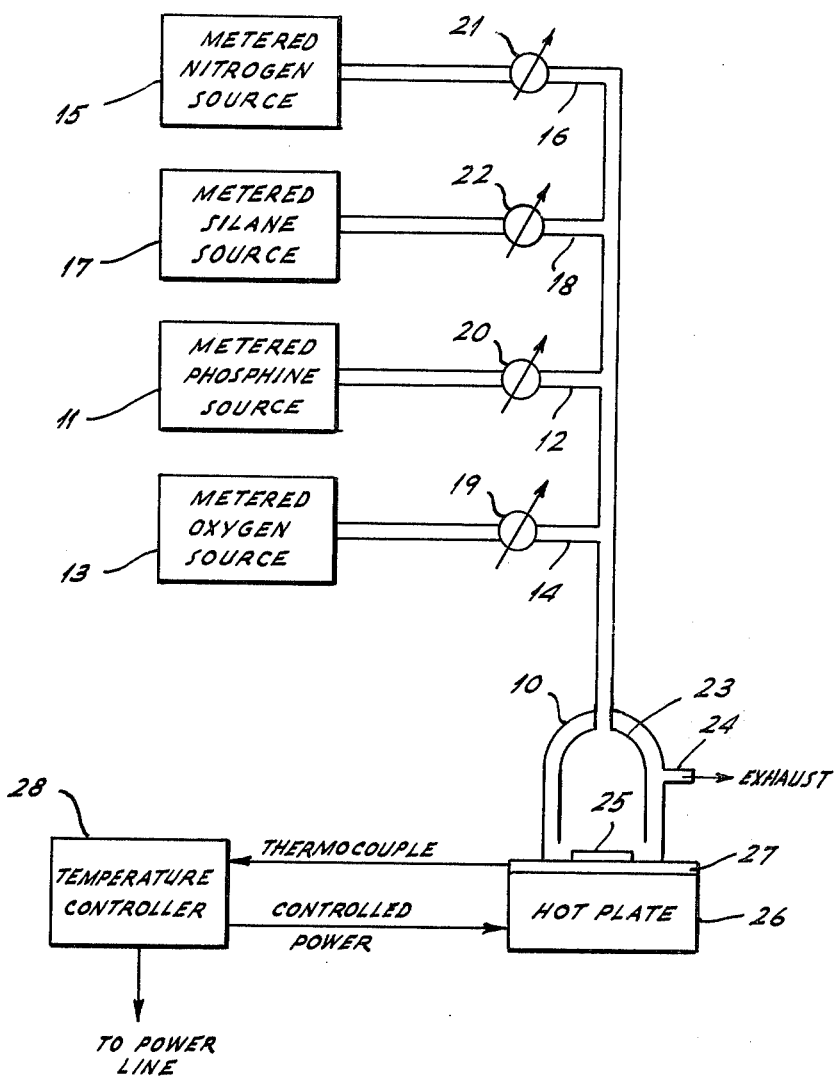
FIG. 1 shows an apparatus for depositing the passivating material.

FIG. 1 shows the essential elements of apparatus used to deposit PSG films on germanium devices. A gas-flow reaction chamber 10 is provided with a plurality of reactant gas inputs. A source of phosphine ($PH_3$) 11 is fed in at inlet 12. Oxygen ($O_2$) from source 13 is fed in at inlet 14. Silane ($SiH_4$) from source 17 is fed in at inlet 18. NItrogen ($N_2$) from source 15, for use as the carrier gas, if fed in at inlet 16. Flow regulators 19–22 permit reactant flow adjustment. While not separately shown each source would desirably contain a flow metering device. Chamber 10 is constructed with an inner portion 23 that directs the unheated and unreacted gases so that they impinge directly upon the heated germanium substrate 25. By using silane and phosphine gases that are already diluted with nitrogen, uncontrolled reaction in the unheated portions of the gas flow system is avoided. The reaction products and unreacted gasses are exhausted from chamber 10 by way of exhaust port 24.

Substrate 25 includes the germanium surface that is to be passivated. While not shown in detail 25 will usually be a slice or wafer that contains a large number of devices. These devices will subsequently be separated into the desired individual units. The showings to follow will be related to individual devices and no attempt will be made to portray a complete wafer.

Substrate 25 is heated to the desired reaction temperature by hot plate 26 which includes a metallic heat mass 27. The hot plate can be adjusted to produce the required substrate temperature by means of the temperature controller at 28 with a thermocouple sensor.

A typical deposition temperature is about 400° C. At this temperature the oxygen oxidizes the phosphine to produce phosphorous pentoxide ($P_2O_5$) and the silane to produce silicon dioxide ($SiO_2$). This reaction occurs at the surface of wafer 25 so that these oxides will deposit as a mixture thereon. Desirably the phosphine and silane flow rates are adjusted to give a ratio that results in a phosphorous content in the PSG of about 4% by weight. The nitrogen is not a reactant at 400° C and acts as a carrier or diluent. Its flow rate is adjusted to control the thickness uniformity. Deposition rates in the range 1000 A to 4000 A per minute are preferred. This range of deposition rate is considered to be high in comparison to conventional gas plating rates which are commonly an order of magnitude lower.

Using the above described apparatus PSG films can be quickly applied and controlled in thickness. The passivated germanium devices thus produced are well passivated with a low stress coating that is highly transparent, free of pinholes, impervious to contaminants and most solvents, getters and immobilizes alkali metal ions, and is mechanically quite durable.

At the deposition temperature, and subsequent device fabrication temperatures, it has been found that the deposited PSG is stable and will not dope the germanium by diffusion. Accordingly the passivating coating will not alter the electrical characteristics of the germanium even when applied directly to high resistivity material.

As pointed out above the preferred phosphorous content is about 4% by weight. This is a compromise. Starting with about 1 or 2% phosphorous a substantial improvement in device passivation is noted over silicon dioxide. As the phosphorous content is increased the properties of the devices improve. When about 8% or more phosphorous is present the film surface becomes hygroscopic and will pick up moisture from ordinary ambient air. Where the devices are sealed after fabrication, this is not a problem. However if the finished devices are exposed or if they are plastic encapsulated the higher phosphorous content glass is avoided.

One method that has been successful in permitting the use of a higher phosphorous content glass is to coat the germanium devices with PSG of high phosphorous content, but, before the deposition process is completed, the phosphine flow is terminated so that the outer layer of the film is pure silicon dioxide. This seals off the PSG from the atmosphere. It is preferred that the outer, phosphorous-free portion comprise about 25% of the total film thickness. This means that in an 8000A film the PSG layer will be about 6000A thick and is overlaid by about 2000A of silicon dioxide.

In terms of PSG film thickness it is preferred that at least 500A be present but films several microns thick can be used. The maximum thickness is primarily limited by the ability to deposit continuous metalization lines over the contact steps that must be present to make contact through the passivation layer. Where photodetectors are being made, the film thickness can be adjusted to ¼ wavelength (or a harmonic thickness thereof) at the desired response maximum.

Figure 2:
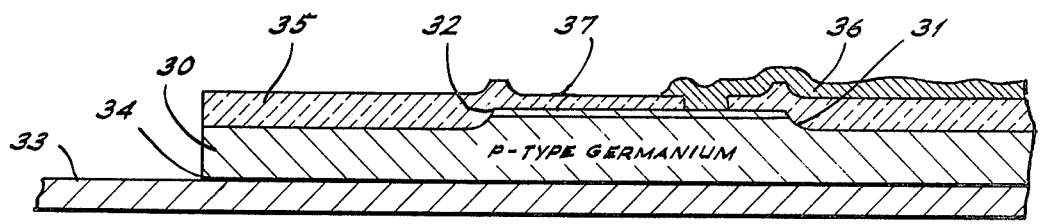
FIG. 2 shows a mesa isolated junction on a semiconductor and an associated passivation layer.

FIG. 2 shows a passivated mesa device. It is to be remembered that this is only one element on a wafer that contains many. Semiconductor substrate 30 is, for example, P-type germanium. A raised portion or mesa 31 has been etched into its upper surface to completely isolate a thin N-type layer 32. Thus an area $p$-$n$ junction is formed with the area being that of the upper portion of the mesa. Typically ohmic contact to the substrate is obtained by a metal plate 33 soldered thereto, using a well known ohmic soldering procedure, at 34. PSG is vapor plated as described above to produce passivating layer 35 which will overcoat the device and will follow the mesa contour as shown.

Desirably the PSG coating over the PN junction region is about one micron thick. This thickness provides good mechanical protection and protection at the germanium surface from ionic contaminants that might exist at the PSG-ambient interface. In general this one-micron layer can be used over the entire germanium chip. However if the device is intended for photo response, and is to be illuminated through the PSG layer, it may be necessary to use a thinner PSG layer over the photosensitive area as shown in FIG. 2. This is important for the shorter wavelengths such as, for example, 1.5 microns. In this case the PSG coating is removed over the sensitive region using a well known photolithographic etching technique. Then PSG is redeposited to the desired thickness for antireflective coating action. This layer is shown at 37. It will be noted that the original PSG layer over the P-N junction region is undisturbed.

Contact is made to the P-type region by etching a small hole in the PSG over the mesa and depositing a layer of metal 36 such as palladium. The metal is made thick enough to fill the etched hole and to form a continuous connection that extends over the top of the PSG layer 35. The metal layer is deposited and contoured using well known deposition and photolithographic techniques that need not be detailed here.

EXAMPLE I

Apparatus of the kind shown in FIG. 1 was used to deposit PSG onto germanium mesa type photo diodes. The germanium wafers were mesa etched, rinsed and dried, whereupon they were placed on the substrate heater. Then the desired gas flows were established and the substrate heater operated to bring the wafer to the desired temperature. Deposition was allowed to procede until the desired thickness of PSG achieved. At this point the flow of phosphine was cut off and deposition continued to produce the desired silicon dioxide cap. Where the silicon dioxide cap was not desired the phosphine supply was left on until the end of the deposition cycle.

The following flow rates in cc per minute were used: 14.8-silane, 2.7 phosphine, 196 oxygen, and 18000 nitrogen. With a substrate temperature of 400° C, PSG having about 4% by weight phosphorous was deposited at a rate of about 2000A/minute. The above flow rates produce a phosphine to silane ratio of about 18.2%.

EXAMPLE II

The process and conditions of Example I were used except that the phosphine to silane ratio was increased to 37%. The PSG deposited contained 8% by weight phosphorous. The diodes made using this material had superior electrical performance as compared to those of Example I, but the exposed PSG would pick up visible moisture from the laboratory ambient air. This moisture pick up was avoided when the silicon dioxide cap was used.

EXAMPLE III

Two groups of germanium mesa photo diodes were fabricated so as to make all units as much alike as possible. The structures were optimized for radiant energy response at 1.35 microns. Half of the units were left uncoated as controls and the other half were coated with PSG as described in Example I to produce a thickness of one quarter wavelength at 1.35 microns. The control units had an average responsivity to a spot of 1.35 micron radiant energy focused to an area smaller than the mesa diameter of 0.48 amps per watt. The average responsivity of the coated devices was 0.66 amps per watt. These values represent quantum efficiencies of 44% and 61% respectively. Thus the antireflective coating produced a 38.6% improvement in efficiency. This is only 5.4% lower than the improvement that would be obtained from a perfect PSG antireflective coating.

A passivating coating for germanium devices has been described along with a process for depositing such coatings. Also examples of such coating and their antireflective performance have been given. Clearly there are alternatives and equivalents that would occur to a person skilled in the art. Accordingly it is intended that the scope of my invention be limited only by the following claims.

I claim:

1. A germanium semiconductor device with a passivating coating comprising a mixture of silicon dioxide and phosphorous pentoxide in direct, intimate contact with the surface of said germanium semiconductor device, said coating being formed by a low temperature, high rate vapor plating process and containing between about 4 percent and about 8 percent phosphorous by weight.

2. A germanium semiconductor device with a passivating coating comprising a mixture of silicon dioxide and phosphorous pentoxide in direct, intimate contact with the surface of said germanium semiconductor device, said coating being formed by a low temperature, high rate vapor plating process and containing between about 4 percent and about 8 percent phosphorous by weight and an outer cap of silicon dioxide covering said mixture of silicon dioxide and phosphorous pentoxide.

3. The coated germanium semiconductor device of claim 2 wherein said outer cap has a thickness about one-third that of the phosphorous containing layer.

4. A germanium semiconductor device with a passivating-coating comprising a mixture of silicon dioxide and phosphorous pentoxide in direct, intimate contact with the surface of said germanium semiconductor device, said coating being formed by a low temperature, high rate vapor plating process, containing between about 4 percent and about 8 percent phosphorous by weight and having a thickness of approximately one-quarter wavelength of the electromagnetic energy to which said germanium semiconductor device is responsive, whereby said coating forms an antireflection coating for said device.

5. The coated germanium semiconductor device of claim 4 where said coating has a thickness in the range of 0.25 to 0.45 microns whereby said device acts as an antireflecting coating for energy having a wavelength four times the thickness of said coating.

6. The device of claim 5 wherein said coating has a thickness of approximately 0.34 microns, whereby said coating acts as an antireflection coating for energy incident on said device and having a wavelength of approximately 1.35 microns.

* * * * *